United States Patent
Kono et al.

(10) Patent No.: US 7,034,637 B2
(45) Date of Patent: Apr. 25, 2006

(54) ELECTRONIC COMPONENT

(75) Inventors: Daiji Kono, Ornihachiman (JP); Hiroaki Kikuta, Rittou (JP)

(73) Assignee: Murata Manufacturing Co., Ltd., (JP)

( * ) Notice: Subject to any disclaimer, the term of this patent is extended or adjusted under 35 U.S.C. 154(b) by 55 days.

(21) Appl. No.: 10/828,320

(22) Filed: Apr. 21, 2004

(65) Prior Publication Data

US 2004/0207488 A1 Oct. 21, 2004

(30) Foreign Application Priority Data

Apr. 21, 2003 (JP) ............................. 2003-115132
Mar. 31, 2004 (JP) ............................. 2004-105811

(51) Int. Cl.
*H03H 7/01* (2006.01)
*C03C 10/00* (2006.01)

(52) U.S. Cl. .................... 333/185; 333/181; 501/32
(58) Field of Classification Search ................ 333/181, 333/184, 185; 501/9, 32
See application file for complete search history.

(56) References Cited

U.S. PATENT DOCUMENTS

| 5,051,712 | A | * | 9/1991 | Naito et al. ................. 333/185 |
| 5,453,316 | A | * | 9/1995 | Morii et al. ................. 428/210 |
| 5,583,470 | A | * | 12/1996 | Okubo ........................ 333/185 |
| 5,602,517 | A | * | 2/1997 | Kaneko et al. .............. 333/185 |
| 5,747,396 | A | * | 5/1998 | Miyakoshi et al. ........... 501/32 |
| 5,935,887 | A | * | 8/1999 | Sudo et al. ................... 501/80 |
| 6,448,195 | B1 | * | 9/2002 | Kishida et al. ................ 501/32 |
| 6,806,794 | B1 | * | 10/2004 | Yamamoto et al. .......... 333/185 |
| 6,853,268 | B1 | * | 2/2005 | Harada ........................ 333/185 |
| 6,871,391 | B1 | * | 3/2005 | Tokuda et al. .............. 29/602.1 |

FOREIGN PATENT DOCUMENTS

| CN | 1228068 A | | 9/1999 |
| CN | 1304894 A | | 7/2001 |
| JP | 62-22245 | | 5/1987 |
| JP | 3-58164 | | 9/1991 |
| JP | 03218944 A | * | 9/1991 |
| JP | 6-17249 | | 3/1994 |
| JP | 10-338545 | | 12/1998 |
| JP | 2000-331831 | | 11/2000 |

OTHER PUBLICATIONS

Chinese office action dated Apr. 1, 2005 (w/ English translation of relevant portions).

* cited by examiner

*Primary Examiner*—Seungsook Ham
(74) *Attorney, Agent, or Firm*—Dickstein, Shapiro, Morin & Oshinsky, LLP.

(57) ABSTRACT

An electronic component including a magnetic member comprising an iron oxide magnetic composition, a nonmagnetic member in contact with the magnetic member and including a glass ceramic composite composition, and an internal conductor portion disposed in at least one of the magnetic member and the nonmagnetic member. The glass ceramic composite composition includes crystallized glass as a main component, and quartz as a sub-component filler. The crystallized glass contains 25 percent by weight to 55 percent by weight of $SiO_2$, 30 percent by weight to 55 percent by weight of MgO, 5 percent by weight to 30 percent by weight of $Al_2O_3$, and 0 percent by weight to 30 percent by weight of $B_2O_3$, and the content of the quartz is 5 percent by weight to 30 percent by weight relative to 100 percent by weight of the crystallized glass.

8 Claims, 7 Drawing Sheets

FIG. 12 ical ELECTRONIC COMPONENT

BACKGROUND OF THE INVENTION

1. Field of the Invention

The present invention relates to an electronic component comprising a ceramic and a conductor, and particularly to an electronic component comprising a magnetic material used as a base material and a glass ceramic composite composition used in a portion having different magnetism, dielectricity and insulation.

Typical electronic components include EMI-countermeasure components such as a multilayer chip inductance device, a multilayer chip impedance device, a multilayer chip common-mode choke coil, a LC filter, and the like. The present invention can also be applied to components other than multilayer chip components, such as a multilayer substrate, a module containing a built-in component, and the like.

2. Description of the Related Art

Electronic components each comprising a magnetic material such as ferrite or the like, and a conductor used for forming a coil or the like have been conventionally known. Recently, improvements in the properties of electronic components have been required for complying with higher frequencies of electronic apparatuses.

In a multilayer chip impedance device which is a typical electronic component, it has been known that radio-frequency property deteriorates due to the stray capacitance caused between internal conductors or between an external electrode and an internal electrode, and there have been many reports of optimization of the structure of an internal conductor or an external conductor.

For example, in Japanese Patent Examined Patent Application Publication No. 62-22245, there is described a structure comprising a nonmagnetic material provided in a magnetic material, for improving the coupling coefficient of a multilayer transformer.

However, in a conventional multilayer chip impedance device, the value of stray capacitance which deteriorates the radio-frequency property is determined by the chip structure and the dielectric constant of the magnetic material used as a base material, and there is a limit in improvements of the properties by appropriately designing a conductor structure.

As disclosed in Patent Unexamined Patent Application Publication No. 2000-331831, a structure comprising a portion using a material with a low dielectric constant is considered as a countermeasure against the above-described problem.

However, in order to burn such different materials at the same time, it is necessary to alleviate the following problems:

(1) deterioration in material properties due to counter diffusion between the materials;

(2) breaking due to a difference between the shrinkage properties; and (3) breaking due to a difference between the thermal expansion coefficients.

There has been not a known material capable of resolving the problems and producing the intended electric properties.

On the other hand, for an electronic component comprising a magnetic material, such as a multilayer transformer or the like, there have been many proposals of a structure comprising a portion using a material with low magnetism, for improving the properties. However, a material for resolving the problems has not yet been found.

SUMMARY OF THE INVENTION

Accordingly, it is an object of the present invention to provide an electronic component comprising a glass ceramic composite composition which has low magnetic permeability, a low dielectric constant, and a high insulation property, which causes little counter diffusion with a magnetic material used as a base material, and which is capable of suppressing the occurrence of breaking, separation, or deformation at a junction portion and suppressing diffusion to an internal conductor, particularly Ag.

In order to resolve the problems, an electronic component of the present invention comprises a magnetic member comprising an iron oxide magnetic composition, a nonmagnetic member in contact with the magnetic member and comprising a glass ceramic composite composition, and an internal conductor portion disposed in at least one of the magnetic member and the nonmagnetic member, wherein the glass ceramic composite composition comprises crystallized glass as a main component, and quartz as a sub-component filler. The crystallized glass preferably contains 25 percent by weight to 55 percent by weight of $SiO_2$, 30 percent by weight to 55 percent by weight of MgO, 5 percent by weight to 30 percent by weight of $Al_2O_3$, and 0 percent by weight to 30 percent by weight of $B_2O_3$, and the content of the quartz is 5 percent by weight to 30 percent by weight relative to 100 percent by weight of the crystallized glass.

The electronic component of the present invention causes little counter diffusion at the interface between the iron oxide magnetic composition used in the magnetic member and the glass ceramic composite composition used in the nonmagnetic member, thereby exhibiting excellent co-sinterability.

Also, the glass ceramic composite composition used in the nonmagnetic member has excellent properties such as low magnetic permeability and a low dielectric constant, and a high insulation property, and has the function to suppress diffusion to a metallic material such as Ag used as an internal conductor. Therefore, a metallic material with low resistance, such as Ag or the like, can be used for the electronic component, thereby decreasing the DC resistance of the electronic component.

DESCRIPTION OF THE PREFERRED EMBODIMENTS

An electronic component using a glass ceramic composite composition according to each of embodiments of the present invention will be described in detail below with reference to FIGS. 1 to 10.

First Embodiment

FIGS. 1 to 6 are schematic sectional views each showing an electronic component using a glass ceramic composite composition according an embodiment of the present invention.

Each of the electronic components shown in FIGS. 1 to 6 comprises a magnetic member 2 having a substantially rectangular prism or disk shape, a nonmagnetic member 1 provided in the magnetic member and comprising the glass ceramic composite composition, and internal electrodes 4 functioning as coil-shaped or layer-shaped internal conductors and provided in at least one of the nonmagnetic member 1 and the magnetic member 2. Each of the electronic components preferably further comprises external electrodes 5 electrically connected to the internal electrodes 4.

Each of the electronic components comprises the nonmagnetic member 1 using the glass ceramic composite composition, and thus a stray capacitance produced between the internal electrodes 4 and the external electrodes 5 can be decreased to alleviate the problems of co-sintering of the nonmagnetic member 1 and the magnetic member 2 while suppressing deterioration of the radio-frequency property due to the stray capacitance, thereby improving the yield.

Figure 1:
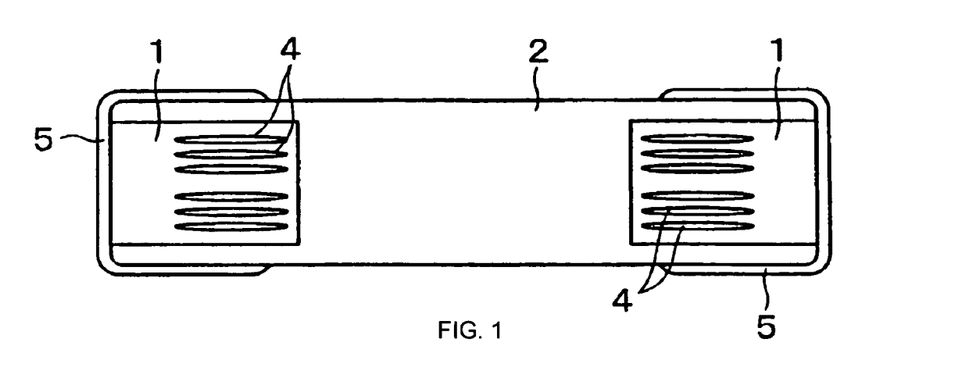
FIG. 1 is a schematic sectional view of an example of an electronic component according to the present invention.
Figure 2:
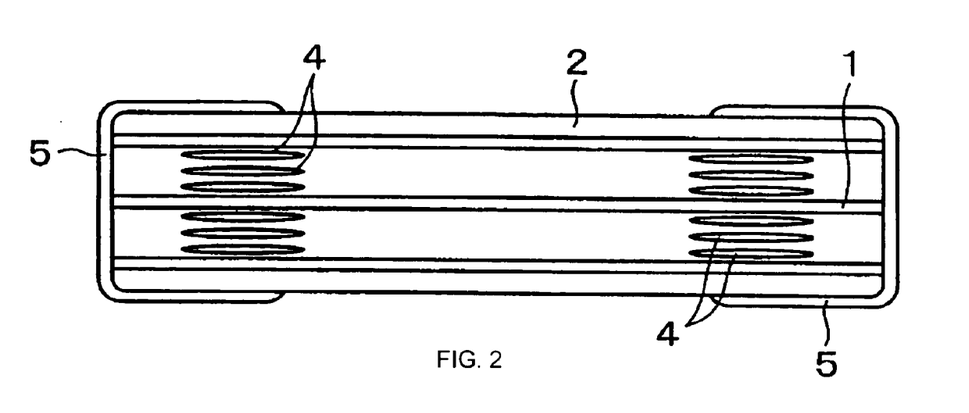
FIG. 2 is a schematic sectional view of another example of an electronic component according to the present invention.
Figure 3:
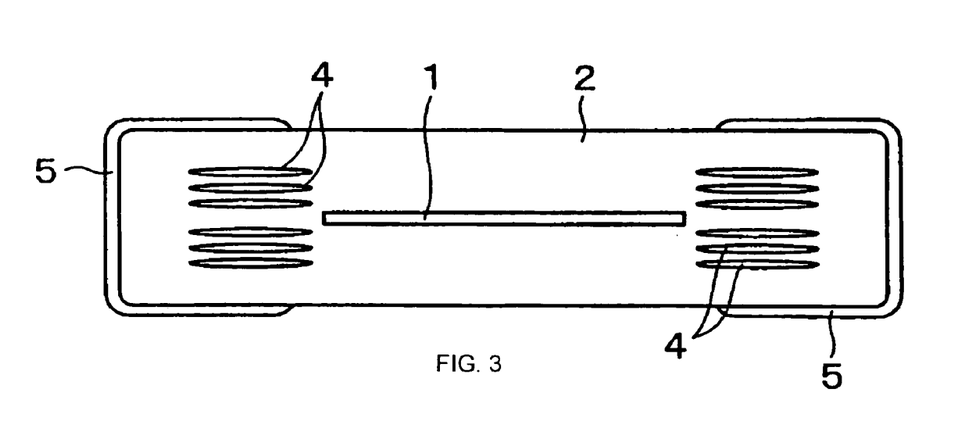
FIG. 3 is a schematic sectional view of still another example of an electronic component according to the present invention.
Figure 4:
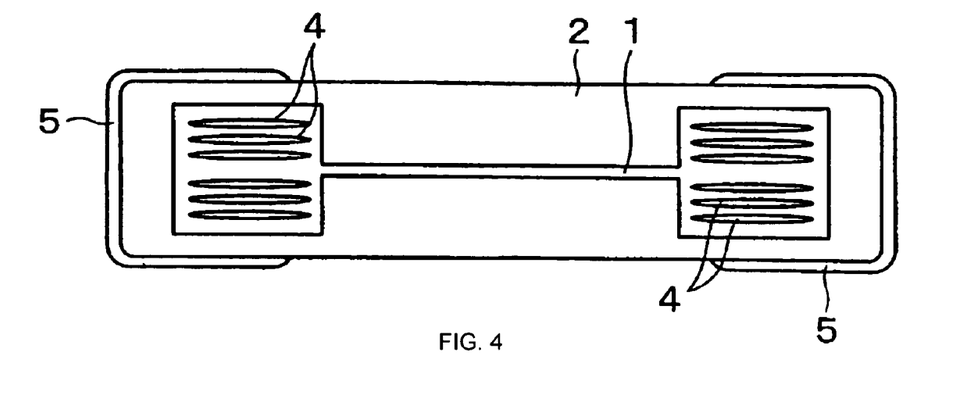
FIG. 4 is a schematic sectional view of a further example of an electronic component according to the present invention.

Furthermore, the electronic component shown in FIG. 1 permits the production of an impedance device which is mainly aimed at decreasing the stray capacitance between the coils and the external electrodes and improving the DC superposition characteristics. The electronic component shown in each of FIGS. 2 to 4 permits the production of an impedance device mainly aimed at improving the DC superposition characteristics.

Figure 5:
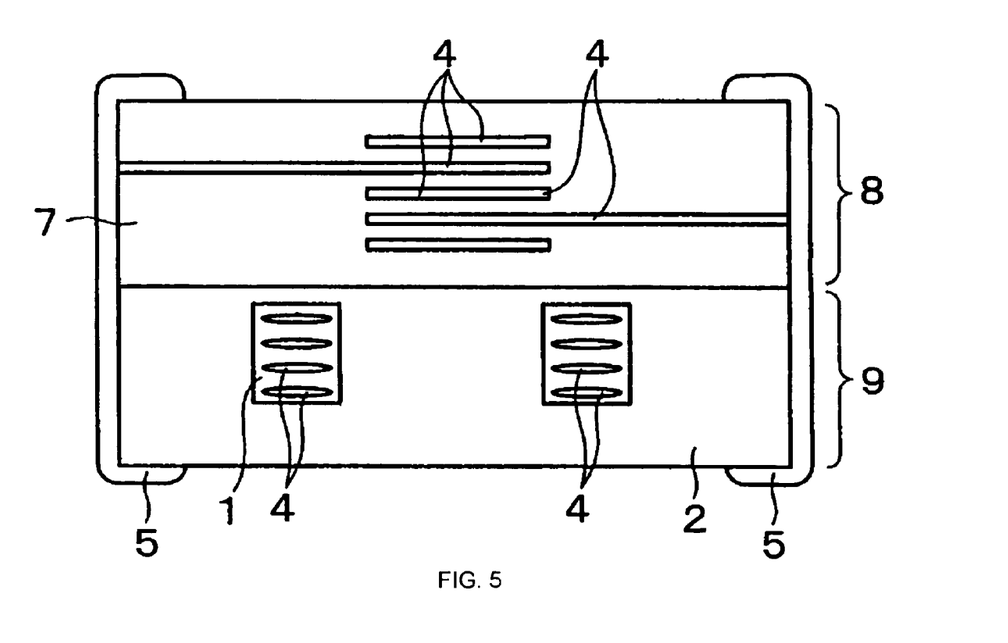
FIG. 5 is a schematic sectional view of a still further example of an electronic component according to the present invention.

The electronic component shown in FIG. 5 is a LC device in which a plate-shaped capacitor portion 8 comprising internal electrode layers 4 opposing each other in a dielectric member 7, and a plate-shaped inductance portion 9 comprising internal electrode coils 4 provided in a magnetic member 2 are laminated. As a material for the dielectric member 7, a dielectric material generally used for a capacitor, or the glass ceramic composite composition can be used. The electronic component permits the production of a LC device mainly aimed at decreasing the stray capacitance between the coils in the inductance portion 9.

Figure 6:
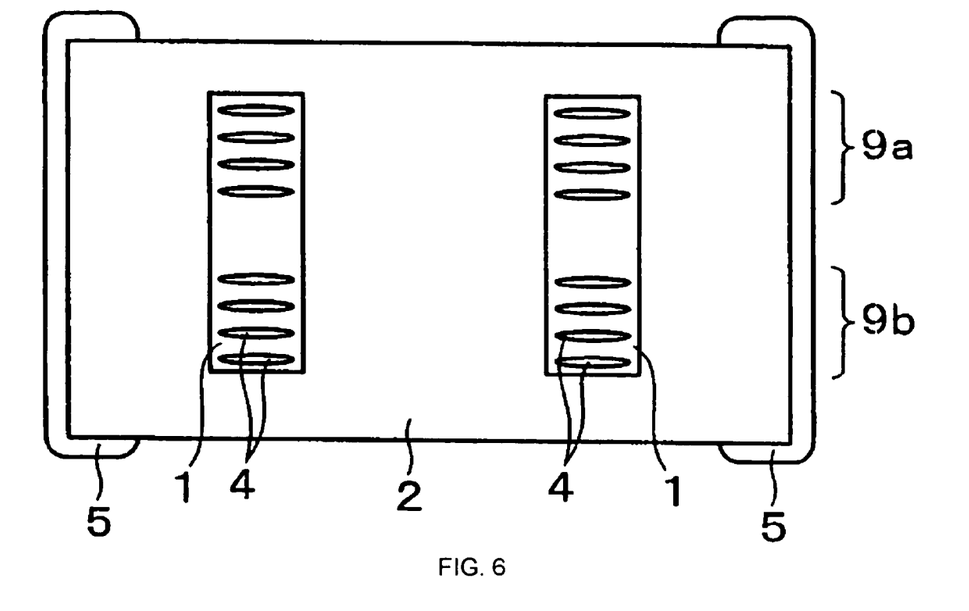
FIG. 6 is a schematic sectional view of a further example of an electronic component according to the present invention.

The electronic component shown in FIG. 6 permits the production of a common mode choke coil device mainly aimed at improving coupling between coils in inductance portions 9a and 9b, decreasing the stray capacitance between the coils, and improving the insulation between the coils.

The glass ceramic composite composition used in the nonmagnetic member comprises crystallized glass as a main component, and quartz used as a sub-component filler. The crystallized glass contains 25 percent by weight to 55 percent by weight of $SiO_2$, 30 percent by weight to 55 percent by weight of MgO, 5 percent by weight to 30 percent by weight of $Al_2O_3$, and 0 percent by weight to 30 percent by weight of $B_2O_3$, and the content of the quartz is 5 percent by weight to 30 percent by weight relative to 100 percent by weight of the crystallized glass. The quartz is dispersed in the glass. Details will be described below.

Second Embodiment

Figure 7:
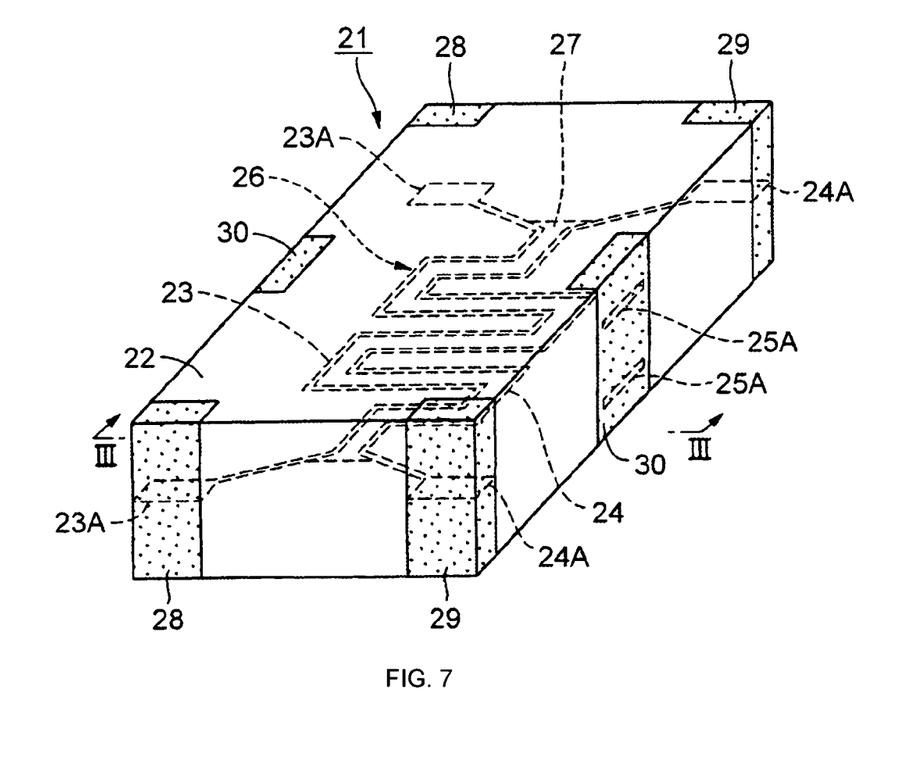
FIG. 7 is a perspective view of a principal portion of a noise filter as an electronic component according to the present invention.
Figure 8:
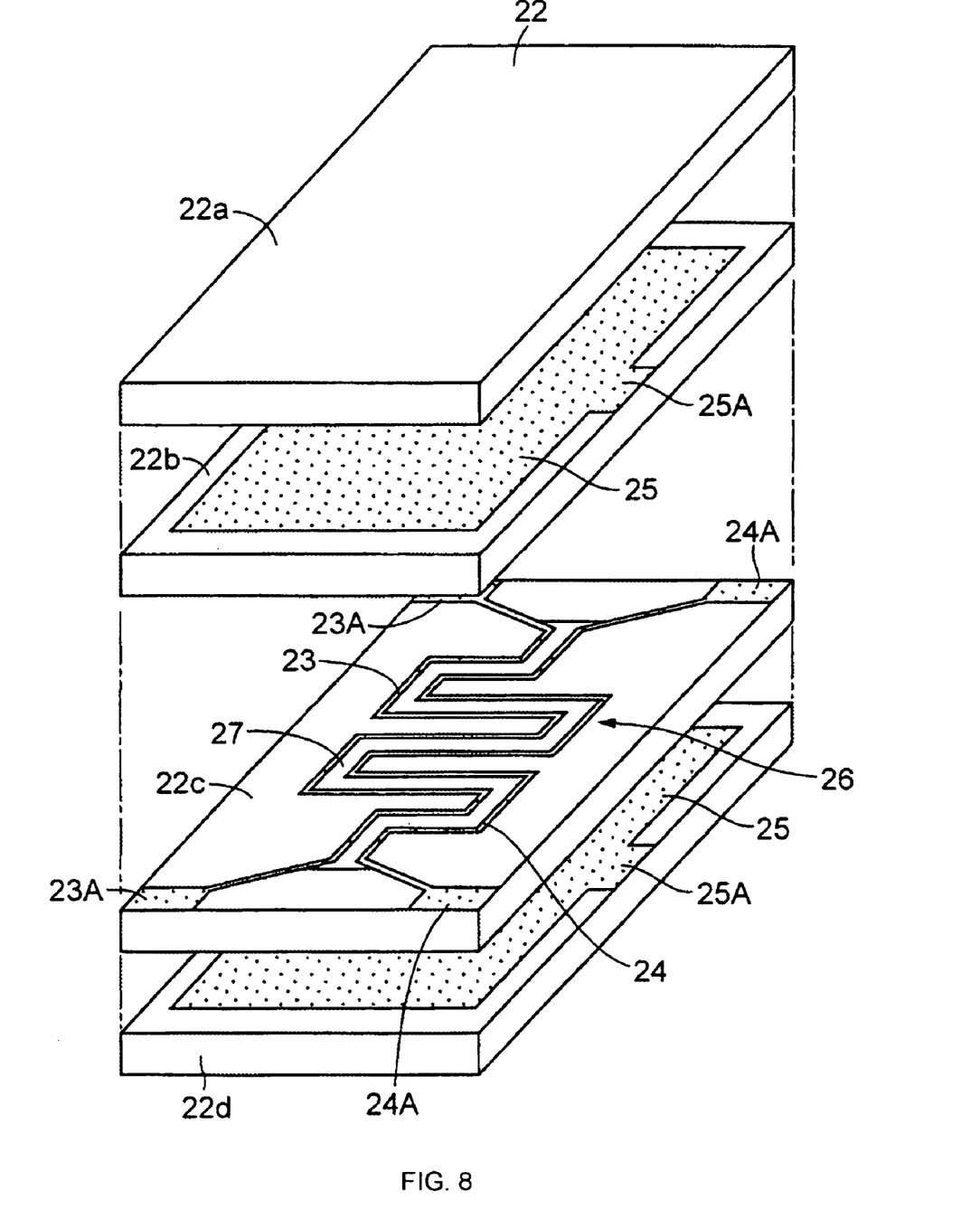
FIG. 8 is an exploded perspective view of the noise filter shown in FIG. 7.
Figure 9:
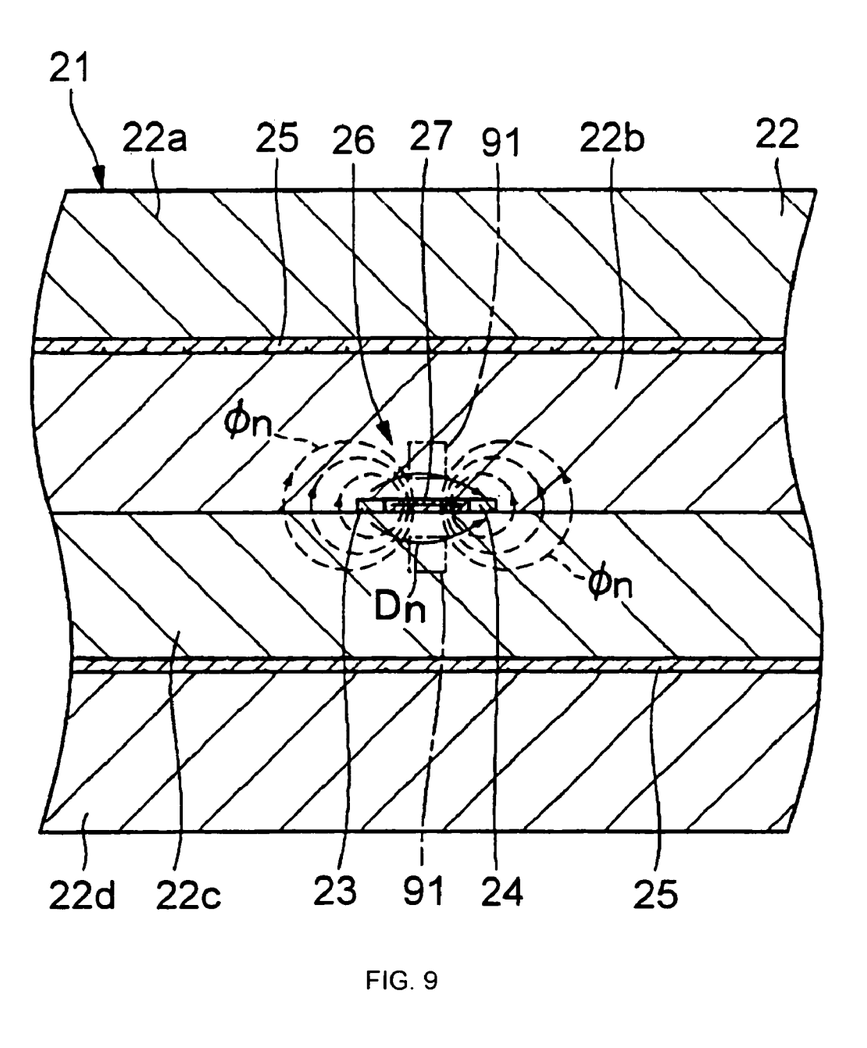
FIG. 9 is a sectional view showing a state in which a normal mode signal propagates, taken along line III—III in FIG. 7.
Figure 10:
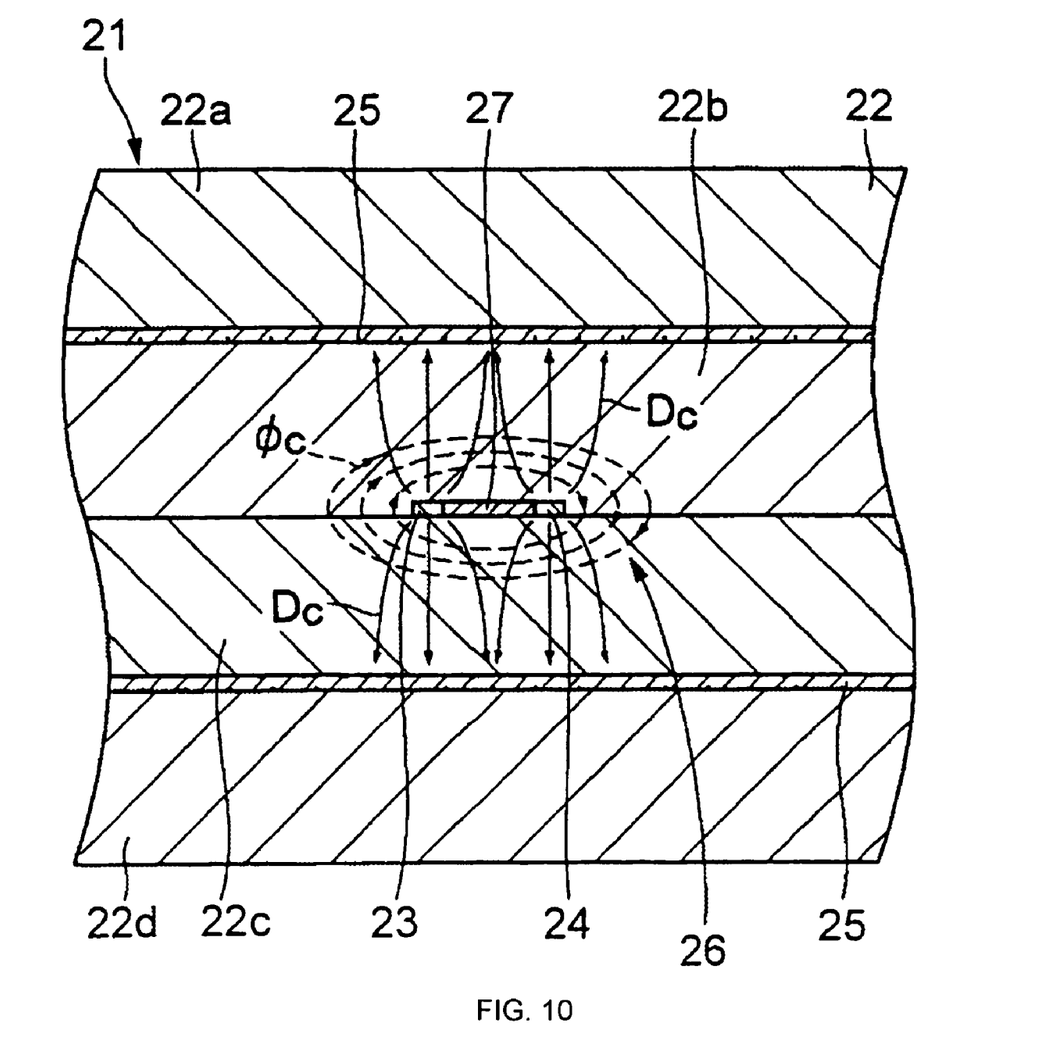
FIG. 10 is a sectional view showing a state in which a common mode signal propagates, taken along line III—III in FIG. 7.

FIG. 7 is a perspective view showing a principal portion of a noise filter as an electronic component according to another embodiment of the present invention. FIG. 8 is an exploded perspective view of the noise filter. FIG. 9 is a sectional view showing a state in which a normal mode signal propagates, taken along line III—III in FIG. 7. FIG. 10 is a sectional view showing a state in which a common mode signal propagates, taken along line III—III in FIG. 7.

The noise filter 21 shown in FIG. 7 roughly comprises magnetic layers 22 (the magnetic layers 22a to 22d shown in FIG. 8), signal lines 23 and 24, ground electrodes 25A, a dielectric member 27, signal electrode terminals 28 and 29, and ground electrode terminals 30.

Each of the signal lines 23 and 24 is formed in a strip shape by using a conductive metal material, and the two signal lines 23 and 24 are disposed between the magnetic layers 22b and 22c. The signal lines 23 and 24 extend in parallel with each other with a predetermined space therebetween. Also, each of the signal lines 23 and 24 has a zigzag portion (meander) zigzagging in the short-side direction (width direction) of the magnetic layers 22b and 22c, and portions extending in the long-side direction (length direction) thereof. The extension directions of each of the signal lines 23 and 24 in the long-side direction and the short-side direction may be changed with each other.

The dielectric member 27 comprises a nonmagnetic medium used as a heterogeneous medium provided between the two signal lines 23 and 24, and is formed by using the glass ceramic composite composition of the present invention. The dielectric member 27 fills in the space between the two signal lines 23 and 24 disposed in parallel to each other. As a material for the dielectric member 27, the same glass ceramic composite composition as described in the first embodiment can be used.

The noise filter 21 of this embodiment has the above-described construction. The working principle of the noise filter 21 will be described below.

First, the noise filter 21 is disposed on a substrate having two wirings provided thereon for transmitting a differential signal, and the signal electrode terminals 28 and 29 are connected to the respective wirings at intermediate positions thereof. Also, the ground electrode terminals 30 are connected to respective ground terminals. As a result, a signal is transmitted through a transmission line comprising the signal lines 23 and 24, and the ground electrodes 25, the ground electrodes 25 being kept at a ground potential.

When a common mode signal propagates through each of the signal lines 23 and 24, the directions of the currents flowing through the signal lines 23 and 24 are the same. Since the signal lines 23 and 24 are disposed in parallel and adjacent to each other, the magnetic fluxes of the signal lines 23 and 24 are strengthened by each other so that the signal lines 23 and 24 act as a line for the common mode signal.

Also, the signal lines 23 and 24 are formed between the magnetic layers 22b and 22c, and thus the transmission line 26 comprising the signal lines 23 and 24 and the ground electrodes 25 for the common mode signal has an inductance L and a capacitance C between the transmission line 26 and the ground electrodes 25 due to the dielectric constant of the magnetic layers 22b and 22c.

Namely, each of the signal lines 23 and 24 functions equivalently with a distributed constant circuit for the common mode signal, and thus the common mode signal passing through each of the signal lines 23 and 24 is transmitted with no loss in a frequency region in which the inductance L and the capacitance C are kept constant. On the other hand, as the frequency of the common mode signal increases, the permeability of the magnetic layers 22b and 22c is changed to cause a loss R (magnetic loss) of the inductance L. Therefore, the common mode signal in a high frequency region attenuates due to the magnetic loss.

On the other hand, when a normal mode signal propagates through each of the signal lines 23 and 24, the transmission line 26 is mainly formed between the signal lines 23 and 24. In this case, the directions of the currents flowing through the signal lines 23 and 24 are opposite to each other, and the amounts of the currents are substantially the same. Therefore, the magnetic fluxes of the signal lines 23 and 24 are canceled by each other (offset) to decrease the inductance L and loss R (magnetic loss), as compared with the common mode signal.

However, when the signal lines 23 and 24 are formed in a homogeneous medium, the effective material characteristics in the common mode are the same as those in the normal mode. Namely, the ratio of the normal mode loss to the common mode loss is constant at any frequency, and the noise suppressing effect in signal transmission is impaired to cause the problem that the signal attenuates when the noise suppressing effect is increased.

However, in this embodiment, the dielectric member 27 having a lower relative permeability $\mu r_1$ than the relative permeability $\mu r_0$ of the magnetic layers 22b and 22c is provided between the signal lines 23 and 24. Therefore, a magnetic flux $\phi n$ produced in the normal mode passes (crosses) through the dielectric member 27 as shown in FIG. 9, while a magnetic flux $\phi c$ produced in the common mode does not pass through the dielectric member 27 as shown in FIG. 10.

In a comparison between an electronic component comprising the dielectric member 27 and an electronic component without the dielectric member 27, the effective relative permeability $\mu wn$ in the path of the magnetic flux $\phi n$ produced in the normal mode is decreased by the dielectric member 27, while the effective relative permeability $\mu wc$ in the path of the magnetic flux $\phi c$ produced in the common mode is not decreased.

When the effective relative permeability is decreased, a frequency (where the real part $\mu'$ and the imaginary part $\mu''$ of permeability corresponding to the effective relative permeability are the same) where a loss peak occurs tends to shift to the higher frequency side. Therefore, when the dielectric member 27 is not provided, a loss peak occurs at a frequency of about several MHz, while when the dielectric member 27 is provided, a loss peak occurs at a frequency of about several tens MHz. The magnitude of the loss which is determined by the ratio ($\mu''/\mu'$) of the imaginary part $\mu''$ to the real part $\mu'$ and the magnitude of the imaginary part $\mu''$ when the dielectric member 27 is provided is smaller than that when the dielectric member 27 is not provided.

Therefore, for the normal mode signal, the frequency where a peak of the magnetic loss R occurs shifts to the higher frequency side, and the magnetic loss R itself decreases. As a result, the common mode signal can be removed from a low frequency region, while the normal mode signal up to a high frequency component can be propagated without attenuation. Therefore, the signal in the normal mode, which is a necessary mode, can be transmitted without waveform rounding, and thus the maintenance of waveform quality and the noise rejection effect can be satisfied.

In the electronic component shown in FIG. 7, particularly the dielectric member 27 has low ∈r to improve the freedom of the distance between the ground electrodes, and to improve impedance matching in a circuit connected to the noise filter. Therefore, the reflection loss of the noise filter can be decreased, and an increase in noise due to resonance and the distortion of a signal waveform can be suppressed.

Third Embodiment

The reasons for determining the composition range of the glass ceramic composite composition used in the above-described electronic components will be described below.

Namely, the glass ceramic composite composition used for the nonmagnetic member comprises crystallized glass as a main component, and quartz used as a sub-component filler. The crystallized glass contains 25 percent by weight to 55 percent by weight of $SiO_2$, 30 percent by weight to 55 percent by weight of MgO, 5 percent by weight to 30 percent by weight of $Al_2O_3$, and 0 percent by weight to 30 percent by weight of $B_2O_3$, and the content of the quartz is 5 percent by weight to 30 percent by weight relative to 100 percent by weight of the crystallized glass. The quartz is dispersed in the glass. The reasons for determining the composition will be described below.

Figure 11:
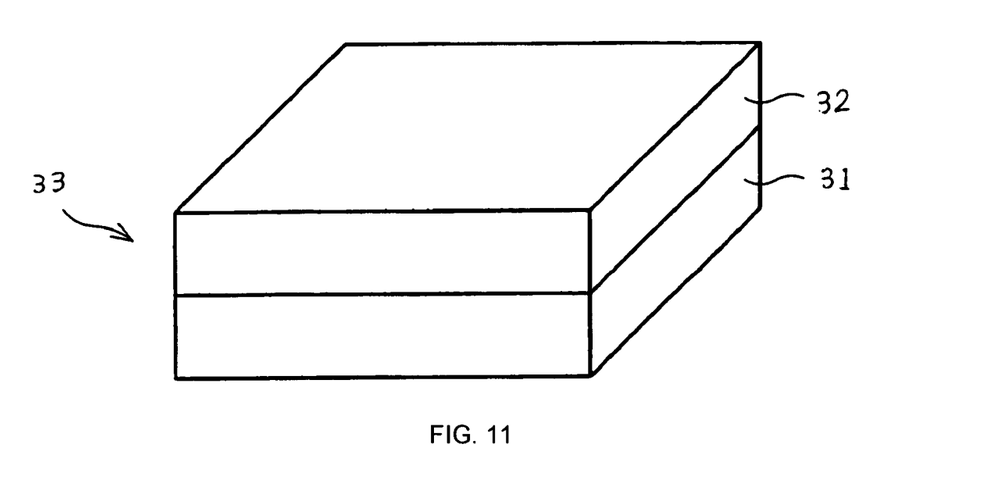
FIG. 11 is a perspective view showing a sample for evaluating counter diffusion of a glass ceramic composite composition with a magnetic material.
Figure 12:
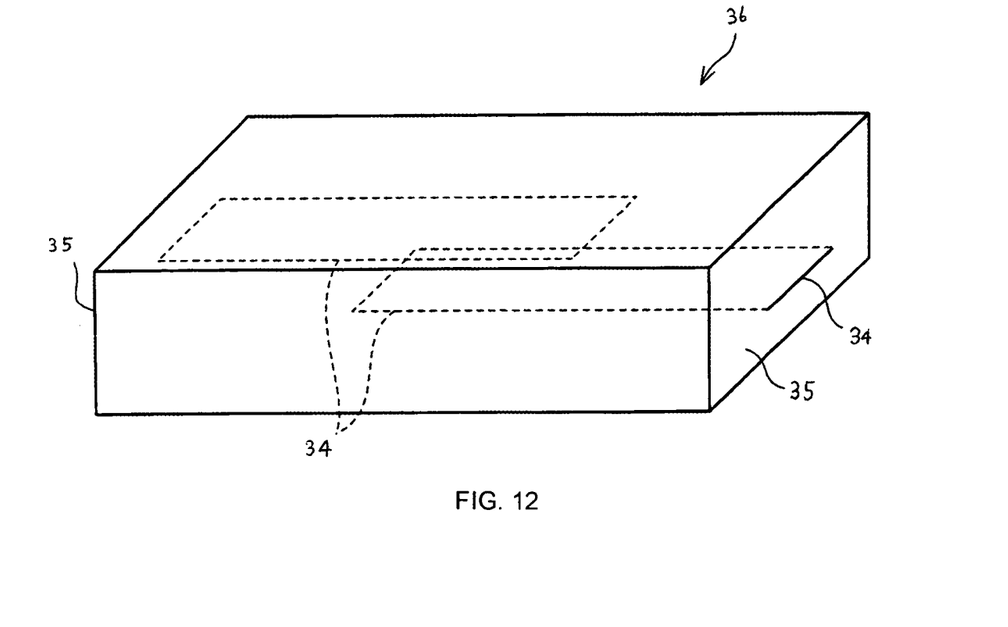
FIG. 12 is a perspective view showing a sample for evaluating the insulation property of a glass ceramic composite composition.

FIG. 11 is a perspective view showing a sample for evaluating the counter diffusion between the glass ceramic composite composition and a magnetic material. FIG. 12 is a perspective view showing a sample for evaluating insulation of the glass ceramic composite composition.

First, a material system comprising a mixture of glass and a filler was used as a material to be co-sintered with a Ni—Cu—Zn magnetic material (Sample No. 1 shown in Table 4) used as the magnetic material, and the materials prepared as described below were examined.

The materials were selected under selection conditions in which relative permeability $\mu r \neq 1$, relative dielectric constant $\in r \leq 8$, and thermal expansion coefficient $5 \leq \alpha \leq 15$ ppm/° C., and the counter diffusion between the magnetic material and each of Ag, Ag/Pd (85/15% by weight), and Au used for the internal conductors was evaluated.

The materials were prepared to have the composition ratios (percent by weight) of the respective final compositions shown in Table 1, melted at 1600° C. in a Pt crucible, and then rapidly cooled in water to obtain glass materials.

Each of the glass materials was finely ground for 64 hours to 80 hours by a ball mill using a PSZ (partially stabilized zirconia) medium of 5 mm in diameter and toluene as a solvent.

Then, in consideration of sinterability, a predetermined filler was added to each prepared glass material so that the composition ratio of each of the final products shown in Table 1 was obtained, and the resultant mixture was finely ground for 16 hours by a ball mill using a PSZ medium and toluene as a solvent.

Next, 15 percent by weight of a PVB (polyvinyl butyral) binder was added to the thus-prepared mixture and further mixed for 6 hours to obtain a slurry. The resultant slurry was dried by a doctor blade method to obtain a sheet compact having a thickness of about 50 μm and comprising the glass ceramic composite composition.

Next, the magnetic material was prepared with the composition of Sample No. 1 shown in Table 4 and mixed for 16 hours by a ball mill using a PSZ medium in pure water. After water was evaporated by a hot plate, the material was calcined at 750° C. to 800° C. The calcined powder was ground for 48 hours by a ball mill using a PSZ medium and a mixture of Ekinen toluene at a ratio of 1/1 as a solvent.

After grinding, 15 percent by weight of a PVB binder was added to the resultant material and further mixed for 16 hours to obtain a slurry. The resultant slurry was dried by a doctor blade method to obtain a sheet compact having a thickness of about 50 μm and comprising the magnetic material.

A plurality of the sheets of the glass ceramic composite material and a plurality of the sheets of the magnetic material were stacked to form laminated structures each having a thickness of 600 μm. Then, the structures were pressure-bonded together by WIP (hot water isotropic press) with 147 MPa.

The pressure-bonded material was cut into a square having a side length of 4 times as large as the thickness to obtain a sheet 33 comprising a glass ceramic composite composition 31 and a magnetic material 32, and the sheet 33 was used as a sample for evaluating counter diffusion with the magnetic material, as shown in FIG. 11.

Also, a paste formed by adding an ethyl cellulose binder to an Ag or Au powder was coated to a width of 200 μm and a thickness of 25 μm on the sheet 33. A plurality of the sheets 33 were stacked to form a shape in which internal electrodes (internal conductors) comprising the paste were incorporated, the shape having a thickness of 1 mm and a side of 2 mm and used as a sample for evaluating counter diffusion with the internal electrodes.

Each of the samples was burned at 900° C. to 1000° C. for a retention time of 2 hours, and ∈r and the thermal expansion coefficient α and counter diffusion were measured. The evaluation results are shown in Table 2.

The internal polished surface was observed by WDX (wavelength dispersive X-ray spectroscopy), and an intensity was converted to a density. Also, a diffusion range in which the density was 0.1% or more was determined for diffusion between the glass ceramic composite composition and the ceramic material, and a diffusion range in which the density was 0.5% or more was determined for diffusion between the glass ceramic composite composition and the conductor material. In Table 2, when the range was 25 μm or less from the joint interface between the materials, counter diffusion was evaluated as "○"; when the range was 25 μm to 50 μm, counter diffusion was evaluated as "Δ"; and when the range was 50 μm or more, counter diffusion was evaluated as "x".

In the column of "Overall evaluation of Table 2, examples of the present invention are marked with "○", and the other samples were comparative examples. This applies to the other tables.

TABLE 1

| Sample No. | Glass composition | | | | | | | Filler | | |
|---|---|---|---|---|---|---|---|---|---|---|
| | $SiO_2$ | $B_2O_3$ | $Al_2O_3$ | CaO | MgO | $K_2O$ | $Na_2O$ | $Al_2O_3$ | $2MgO/SiO_2$ | $SiO_2$ quartz |
| A | 86 | 13 | | | | 1 | | 43 | | |
| B | 60 | 30 | | 10 | | | | 100 | | |
| C | 60 | 22 | | 6 | 4 | 4 | 4 | 100 | | |
| D | 86 | 13 | | | | 1 | | | | 43 |
| E | 60 | 30 | | 10 | | | | | | 100 |
| F | 60 | 22 | | 6 | 4 | 4 | 4 | | | 100 |
| G | 79 | 19 | | | | 2 | | | 25 | |
| H | 44 | | 9 | 21 | 21 | 2.5 | 2.5 | | 25 | |
| I | 60 | | 20 | | | 10 | 10 | | 25 | |
| J | 60 | 11 | 5.5 | 17 | 5.5 | 1 | | 11 | | |
| K | 44 | | 12 | | 44 | | | 25 | | |
| L | 81 | 17 | | | | 2 | | 67 | | |
| M | 60 | 11 | 5.5 | 17 | 5.5 | 1 | | | | 11 |
| N | 44 | | 12 | | 44 | | | | | 25 |
| O | 44 | | 12 | | 44 | | | | 25 | |
| P | 81 | 17 | | | | 2 | | | | 67 |

TABLE 2

| Sample No. | Evaluation of counter diffusion | | | | Insulation evaluation | | Electric properties | | Overall evaluation |
|---|---|---|---|---|---|---|---|---|---|
| | Magnetic material | Conductor material | | | Constant temperature high humidity | High temperature | ∈r | α (ppm/° C.) | |
| | | Ag | Ag/Pd | Au | | | | | |
| A | ○ | Δ | Δ | ○ | X | X | 4~6 | 3~5 | X |
| B | X | X | X | Δ | X | X | 5~7 | 4~6 | X |
| C | Δ | X | X | Δ | X | X | 7~9 | 5~7 | X |
| D | ○ | Δ | Δ | ○ | X | X | 4~6 | 5~7 | X |
| E | X | X | X | Δ | X | X | 4~6 | 7~9 | X |
| F | Δ | X | X | Δ | X | X | 5~7 | 7~9 | X |
| G | Δ | Δ | Δ | ○ | Δ | ○ | 4~6 | 5~7 | X |
| H | ○ | ○ | ○ | ○ | Δ | ○ | 7~9 | 5~7 | X |

TABLE 2-continued

| Sample No. | Evaluation of counter diffusion | | | | Insulation evaluation | | Electric properties | | Overall evaluation |
|---|---|---|---|---|---|---|---|---|---|
| | Magnetic material | Conductor material | | | Constant temperature high humidity | High temperature | $\epsilon r$ | $\alpha$ (ppm/° C.) | |
| | | Ag | Ag/Pd | Au | | | | | |
| I | ○ | ○ | ○ | ○ | Δ | ○ | 7~9 | 8~10 | X |
| J | X | ○ | ○ | ○ | Δ | Δ | 5~7 | 8~10 | X |
| K | ○ | ○ | ○ | ○ | ○ | ○ | 7~9 | 7~9 | ○ |
| L | Δ | ○ | ○ | ○ | X | X | 5~7 | 4~6 | X |
| M | X | ○ | ○ | ○ | Δ | Δ | 4~6 | 9~11 | X |
| N | ○ | ○ | ○ | ○ | ○ | ○ | 6~8 | 8~10 | ○ |
| O | ○ | ○ | ○ | ○ | ○ | ○ | 7~9 | 7~9 | ○ |
| P | Δ | ○ | ○ | ○ | X | X | 3~5 | 7~9 | X |

Table 2 indicates that the glass ceramic composite compositions of Samples K, N and O have low $\epsilon r$ and thermal expansion coefficients α close to that of the magnetic material, and thus cause little counter diffusion with the magnetic material and are easy to co-sinter therewith. Particularly, Sample N using quartz as the filler has low $\epsilon r$ and higher thermal expansion coefficient α. This is possibly due to the fact that quartz has α of as high as about 15 ppm/° C. in the direction perpendicular to the C axis, and $\epsilon r$ is as small as about 4.

As a result of XRD (X-ray diffractometry) of the crystal state of Sample N for evaluation, peaks of enstatite, forsterite and quartz were clearly observed.

Next, each of the samples shown in Table 1 was evaluated with respect to the electric insulation of the glass ceramic composite composition. Namely, as a sample for evaluating the insulation, a test chip having a structure comprising opposed Ag electrodes as internal conductors was prepared and evaluated with respect to moisture resistance and a high-temperature property in an electric field.

The method for preparing the evaluation sample will be describe in detail below.

As shown in FIG. 12, a paste containing Ag powder and an ethyl cellulose binder was coated to a width of 200 μm and a thickness of 25 μm on a sheet compact containing the composition of each of the final products shown in Table 1. The sheets were laminated to form a capacitor structure in which internal electrodes 34 are opposite to each other at a center with a space of 50 μm therebetween, pressure-bonded, and then cut into a compact having a thickness of 1 mm and a side of 2 mm.

Next, the compact was burned at 900° C. for a retention time of 2 hours, and a paste comprising Ag, an ethyl cellulose binder and terpineol was coated on each of the end surfaces where the internal electrodes were exposed. Then, the formed product was baked at 850° C. to form external electrodes 35 comprising the paste at the end surfaces and form a sample 36 for evaluating insulation.

Next, the insulation evaluation sample 36 was set in a constant-temperature constant-humidity bath (constant-temperature constant-humidity condition) at 70° C. and a humidity of 95%, and in a high-temperature bath (high-temperature condition) at 120° C. with a voltage applied to the sample so that the electric field strength was 1.0 kV/mm. In this state, insulation was evaluated by a change in resistance. The results are shown in Table 2.

In Table 2, the number of the samples evaluated under each condition was 30. The time taken until the resistance decreased by 100 times or more after setting was plotted as a deterioration time by the Weibull method. In Table 2, when the 3.33% cumulative failure time exceeded 500 hours, insulation was evaluated as "○"; when the cumulative failure time is 100 hours to 500 hours, insulation was evaluated as "Δ"; and when the cumulative fault time was less than 100 hours, insulation was evaluated as "x".

Table 2 indicates that the glass ceramic composite compositions of Samples K, N and O have low $\epsilon r$, thermal expansion coefficients α close to that of the magnetic material, and high insulation.

Next, in consideration of the material system of Sample N examined as described above, the glass ceramic composite compositions shown in Table 3 (showing the compositions ratios of final compositions) were prepared. Then, a sheet of each glass ceramic composite composition and a sheet of the magnetic material were laminated and burned to prepare an evaluation sample for evaluating co-sinterability with the magnetic material.

A Ni—Cu—Zn magnetic material (Sample 1 shown in Table 4) was used as the magnetic material, and a sheet compact comprising the glass ceramic composite composition and a sheet compact comprising the magnetic material were formed by the same method as described above. These sheets were laminated to have equal thicknesses, pressure-bonded at 60° C. for 30 seconds under 98 MPa, and then cut into the shape shown in FIG. 11. Evaluation samples having different dimensional ratios were prepared.

Each of the evaluation samples was burned for a retention time of 2 hours at a heating rate of 300° C./hr, a top temperature of 900° C., and a cooling rate of 200° C./hr to evaluate cracking and breaking. These evaluation results, the material characteristics and the results of insulation evaluation of the samples are summarized in Table 3.

The counter diffusion and insulation were evaluated by the same methods as described above. In Table 3, when breaking or cracking of the sample surface or separation or cracking at the sample interface was observed with an optical microscope, co-sinterability was evaluated as "x"; and when such a defect was not observed, co-sinterability was evaluated as "○".

In Tables 3 to 5, shape A represents a rectangular prism having a thickness of 500 μm of each material, a total thickness of 1000 μm, and a side length of 4000 μm, and shape B represents a rectangular prism having a thickness of 2000 μm of each material, a total thickness of 4000 μm, and a side length of 8000 μm.

In Table 3, when the density change of the product sintered at each of 900° C. and 950° C. was 5% or less, sinterability was evaluated as "○"; when the density change was 5% to 10%, sinterability was evaluated as "Δ"; and when the density change was 10% or more, sinterability was evaluated as "x".

TABLE 3

| Sample No. | Composition (wt %) SiO$_2$/MgO/Al$_2$O$_3$/B$_2$O$_3$ (quartz) | Co-sinterability Shape A | Co-sinterability Shape B | Counter diffusion Magnetic Material | Counter diffusion Ag conductor | Insulation | Sinterability | εr | α (ppm/° C.) | Overall evaluation |
|---|---|---|---|---|---|---|---|---|---|---|
| 1 | 35/35/10/20(0) | X | X | ○ | ○ | Δ | ○ | 5.9 | 7.5 | X |
| 2 | 35/35/10/20(5) | ○ | ○ | ○ | ○ | Δ | ○ | 5.8 | 8.0 | ○ |
| 3 | 35/35/10/20(10) | ○ | ○ | ○ | ○ | Δ | ○ | 5.7 | 8.5 | ○ |
| 4 | 35/35/10/20(15) | ○ | ○ | ○ | ○ | Δ | ○ | 5.7 | 9.0 | ○ |
| 5 | 35/35/20/10(15) | ○ | ○ | ○ | ○ | ○ | ○ | 6.2 | 9.7 | ○ |
| 6 | 35/35/10/20(20) | ○ | ○ | ○ | ○ | Δ | ○ | 5.6 | 9.4 | ○ |
| 7 | 35/35/20/10(20) | ○ | ○ | ○ | ○ | ○ | ○ | 6.1 | 10.1 | ○ |
| 8 | 35/35/10/20(25) | ○ | ○ | ○ | ○ | Δ | ○ | 5.5 | 9.8 | ○ |
| 9 | 35/35/20/10(25) | ○ | ○ | ○ | ○ | ○ | ○ | 5.5 | 10.1 | ○ |
| 10 | 35/35/10/20(30) | ○ | ○ | ○ | ○ | Δ | Δ | 5.5 | 10.1 | ○ |
| 11 | 35/35/10/20(35) | ○ | X | ○ | ○ | X | X | 5.4 | 10.5 | X |
| 12 | 20/45/25/10(20) | X | X | ○ | ○ | Δ | X | 6.6 | 11.2 | X |
| 13 | 20/60/10/10(20) | X | X | ○ | ○ | Δ | X | 6.2 | 11.7 | X |
| 14 | 25/55/10/10(20) | ○ | ○ | ○ | ○ | Δ | Δ | 6.0 | 11.3 | ○ |
| 15 | 25/40/25/10(20) | ○ | ○ | ○ | ○ | Δ | Δ | 6.5 | 10.8 | ○ |
| 16 | 30/35/25/10(20) | ○ | ○ | ○ | ○ | Δ | ○ | 6.4 | 10.4 | ○ |
| 17 | 30/40/20/10(20) | ○ | ○ | ○ | ○ | ○ | ○ | 6.2 | 10.5 | ○ |
| 18 | 40/35/15/10(20) | ○ | ○ | ○ | ○ | ○ | ○ | 5.9 | 9.9 | ○ |
| 19 | 40/40/10/10(20) | ○ | ○ | ○ | ○ | ○ | ○ | 5.7 | 10.0 | ○ |
| 20 | 50/30/10/10(20) | ○ | ○ | ○ | Δ | Δ | ○ | 5.5 | 9.2 | ○ |
| 21 | 55/25/10/10(20) | ○ | X | ○ | X | Δ | ○ | 5.4 | 8.8 | X |
| 22 | 60/20/10/10(20) | X | X | ○ | X | Δ | ○ | 5.3 | 8.3 | X |
| 23 | 40/40/0/20(20) | ○ | ○ | ○ | ○ | X | X | Δ | 5.2 | 9.3 | X |
| 24 | 37.5/37.5/5/20(20) | ○ | ○ | ○ | ○ | Δ | ○ | 5.4 | 9.3 | ○ |
| 25 | 32.5/32.5/15/20(20) | ○ | ○ | ○ | ○ | Δ | ○ | 5.8 | 9.4 | ○ |
| 26 | 40/30/20/10(20) | ○ | ○ | ○ | ○ | ○ | ○ | 6.0 | 9.7 | ○ |
| 27 | 30/30/20/20(20) | ○ | ○ | ○ | ○ | Δ | ○ | 6.0 | 9.5 | ○ |
| 28 | 27.5/27.5/25/20(20) | ○ | ○ | ○ | ○ | Δ | ○ | 6.2 | 9.5 | ○ |
| 29 | 25/25/30/20(20) | ○ | ○ | ○ | ○ | X | ○ | 6.4 | 9.6 | X |
| 30 | 22.5/22.5/35/20(20) | ○ | ○ | ○ | ○ | X | Δ | 6.7 | 9.7 | X |
| 31 | 30/30/30/10(20) | ○ | ○ | ○ | ○ | Δ | ○ | 6.6 | 10.2 | ○ |
| 32 | 30/30/10/30(20) | ○ | ○ | ○ | Δ | Δ | ○ | 5.5 | 8.8 | ○ |
| 33 | 27.5/27.5/10/35(20) | X | X | ○ | X | Δ | ○ | 5.4 | 8.4 | X |

Table 3 indicates the following:

With a quartz content of less than 5 percent by weight and over 30 percent by weight, breaking easily occurs. Also, with a quartz content of over 30 percent by weight, sintering becomes difficult. The results of breaking evaluation indicate that a quartz content is preferably 15 percent by weight to 25 percent by weight.

With a SiO$_2$ content of less than 25 percent by weight and over 55 percent by weight, breaking easily occurs.

With a MgO content of less than 30 percent by weight and over 55 percent by weight, breaking easily occurs.

In consideration of overall evaluation of the insulation, dielectric property, and thermal expansion coefficient, each of the SiO$_2$ and MgO contents is preferably 30 percent by weight to 45 percent by weight.

With an Al$_2$O$_3$ content of less than 5 percent by weight, Ag easily diffuses. With an Al$_2$O$_3$ content of over 30 percent by weight, εr undesirably increases.

Although burning is possible even if B$_2$O$_3$ is not contained, the melting temperature is increased. With a B$_2$O$_3$ content of over 30 percent by weight, Ag easily diffuses. The B$_2$O$_3$ content is preferably 5 percent by weight to 15 percent by weight.

On the basis of the above-described results, a glass ceramic composite composition suitable for co-sintering with a Ni—Cu—Zn magnetic material could be found.

Next, the material system of Sample N examined as described above was evaluated with respect to co-sinterability with an iron oxide magnetic composition other than Ni—Cu—Zn system. A composition of SiO$_2$/MgO/Al$_2$O$_3$/B$_2$O$_3$ (quartz) at 40/10/10/(20) percent by weight (the quartz ratio was based on 100 percent by weight of SiO$_2$/MgO/Al$_2$O$_3$/B$_2$O$_3$) was formed in a sheet used as a sample by the same method as described above.

The five samples of Samples 1 to 5 shown in Tables 4 and 5 having different compositions and different crystal structures were used as magnetic materials, and formed in sheets used as samples by the same method as described above. The counter diffusion at the material interface and co-sinterability such as breaking or cracking were evaluated by the same methods as described above. In Tables 4 and 5, the amount of each of the oxides mixed is shown by mol %. The evaluation results are shown in Tables 4 and 5.

TABLE 4

| Sample No. | Oxide | | | | | Counter diffusion | Co-sinterability | |
|---|---|---|---|---|---|---|---|---|
| | Fe₂O₃ | ZnO | NiO | CuO | MgO | | Shape A | Shape B |
| 1 (Ni—Cu—Zn system) | 48 | 30 | 10 | 12 | | ○ | ○ | ○ |
| 2 (Ni—Cu—Zn system) | 48 | 5 | 35 | 12 | | ○ | ○ | ○ |
| 3 (Mg—Cu—Zn system) | 48 | 30 | | 12 | 10 | ○ | ○ | ○ |

TABLE 5

| Sample No. | Oxide | | | | | | | | Counter diffusion | Co-sinterability | |
|---|---|---|---|---|---|---|---|---|---|---|---|
| | Fe₂O₃ | CuO | Y₂O₃ | CaCO₃ | BaO | Co₃O₄ | SrO | MgO | | Shape A | Shape B |
| 4 (Ba—Cu system) | 59 | 12 | | | 14 | 11 | 4 | | ○ | ○ | ○ |
| 5 (Y—Ca system) | 54 | | 27 | 15 | | | | 4 | ○ | ○ | ○ |

Any one of the magnetic materials having different compositions and different crystal structures exhibits a low degree of counter diffusion, and co-sintering is relatively easy although there is a limitation of the structure.

The glass ceramic composite composition can easily bonded to not only a Ni—Cu—Zn material but also an iron oxide magnetic composition.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An electronic component comprising:
    a magnetic member comprising an iron oxide magnetic composition;
    a nonmagnetic member in contact with the magnetic member and comprising a glass ceramic composite composition; and
    an internal conductor portion disposed in at least one of the magnetic member and the nonmagnetic member, wherein
    the glass ceramic composite composition comprises crystallized glass as a main component, and quartz as a sub-component filler,
    the crystallized glass containing 25 percent by weight to 55 percent by weight of SiO₂, 30 percent by weight to 55 percent by weight of MgO, 5 percent by weight to 30 percent by weight of Al₂O₃, and 0 percent by weight to 30 percent by weight of B₂O₃, and
    the content of the quartz in the glass ceramic composite composition is 5 percent by weight to 30 percent by weight relative to 100 percent by weight of the crystallized glass.

2. The electronic component according to claim 1, further comprising external electrodes electrically connected to the internal conductor portion.

3. The electronic component according to claim 1, wherein the magnetic member and the nonmagnetic member are laminated together.

4. The electronic component according to claim 3, wherein the internal conductor portion comprises internal electrode layers provided in the nonmagnetic member and internal electrode coils provided in the magnetic member.

5. The electronic component according to claim 4, wherein the internal electrode layers are arranged so as to oppose each other in the nonmagnetic member.

6. A noise filter comprising:
    a plurality of adjacent magnetic layers;
    at least two opposed signal lines disposed between two adjacent magnetic layers of the plurality of adjacent magnetic layers;
    a dielectric member provided between the at least two opposed signal lines; and
    at least two opposed ground electrodes disposed on either side of the at least two opposed signal lines, wherein
    the dielectric member is a glass ceramic composite composition which includes crystallized glass as a main component, and quartz as a sub-component filler,
    the crystallized glass containing 25 percent by weight to 55 percent by weight of SiO₂, 30 percent by weight to 55 percent by weight of MgO, 5 percent by weight to 30 percent by weight of Al₂O₃, and 0 percent by weight to 30 percent by weight of B₂O₃, and
    the content of the quartz in the glass ceramic composite composition is 5 percent by weight to 30 percent by weight relative to 100 percent by weight of the crystallized glass.

7. The noise filter according to claim 6, wherein the at least two opposed signal lines are parallel to each other.

8. The noise filter according to claim 6, wherein the at least two opposed signal lines are each formed as meandering lines.

* * * * *